(12) United States Patent
Wu et al.

(10) Patent No.: US 7,282,953 B2
(45) Date of Patent: Oct. 16, 2007

(54) PRE-BUFFER LEVEL SHIFTER AND INPUT/OUTPUT BUFFER APPARATUS

(75) Inventors: Chih-Hung Wu, Kaohsiung (TW); Meng-Jer Wey, Hsinchu (TW); Chien-Hui Chuang, Taipei Hsien (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 89 days.

(21) Appl. No.: 11/223,742

(22) Filed: Sep. 8, 2005

(65) Prior Publication Data

US 2007/0052445 A1    Mar. 8, 2007

(51) Int. Cl.
*H03K 19/0175* (2006.01)
*H03K 19/094* (2006.01)

(52) U.S. Cl. .............. 326/68; 326/80; 326/81; 326/83; 326/86

(58) Field of Classification Search ............ 326/68, 326/80, 81, 83, 86
See application file for complete search history.

(56) References Cited

U.S. PATENT DOCUMENTS

| 5,821,809 | A | * | 10/1998 | Boerstler et al. | 327/563 |
| 6,104,216 | A | * | 8/2000 | Satoh | 327/78 |
| 6,326,811 | B1 | * | 12/2001 | Coddington et al. | 326/83 |
| 6,624,660 | B2 | * | 9/2003 | Li et al. | 326/83 |
| 2007/0008001 | A1 | * | 1/2007 | Sanchez et al. | 326/80 |

* cited by examiner

*Primary Examiner*—Rexford Barnie
*Assistant Examiner*—Thienvu Tran
(74) *Attorney, Agent, or Firm*—Winston Hsu

(57) ABSTRACT

A pre-buffer level shifter and an I/O buffer apparatus are provided. The pre-buffer level shifter includes a switchable current source, a current mirror, a buffer unit, a first clamping circuit and a second clamping circuit. Because of a clamping circuit inside a thin oxide MOS transistor device of the pre-buffer level shifter, the present invention can control the voltage swing of the signal for driving an output buffer within a suitable voltage range. Thus, the pre-buffer level shifter can correctly drive the output buffer made of thin oxide MOS transistor devices, increase the operating speed and ensure the reliability thereof.

26 Claims, 4 Drawing Sheets

PRE-BUFFER LEVEL SHIFTER AND INPUT/OUTPUT BUFFER APPARATUS

BACKGROUND OF THE INVENTION

1. Field of the Invention

The present invention relates to an I/O (input/output) buffer apparatus. More particularly, the present invention relates to an I/O buffer apparatus having a high-speed pre-buffer level shifter.

2. Description of the Related Art

With the continuous increase in the level of integration of integrated circuits and the speed of operation of the devices, the operating voltage of the core blocks within the integrated circuit continues to decrease. Therefore, the integrated circuits must deploy a suitable I/O (input/output) buffer apparatus for receiving signal from and transmitting signal to an external circuit at a corresponding level.

FIG. 1A is a block diagram of a conventional integrated circuit. As shown in FIG. 1A, the core block 110 of the integrated circuit receives signal from and transmit signal to an external circuit (not shown) through a plurality of I/O buffer apparatuses (represented by the I/O buffer apparatuses 130 and 150) and each corresponding pad (represented by the pad 140). The operating voltage of the core block 110 is VCCK. Hence, when the core block 110 needs to transmit signals to an external circuit through the pad 140, a level exchange must be executed using the I/O buffer apparatus 130 having an operating voltage of VDD. Similarly, when the core block 110 needs to receive signals from an external circuit through the pad 140, a level exchange must be executed using the I/O buffer apparatus 150.

FIG. 1B is a block diagram showing in more detail the I/O buffer apparatus 130 in FIG. 1A. The I/O buffer apparatus 130 as shown in FIG. 1B mainly comprises a level shifter 131, a pre-buffer 132 and an output buffer 133. In general, the output port power voltage VDD has a level greater than the core voltage VCCK. Thus, there is a need to perform a level conversion of the signal DATA output from the core block 110 using the level shifter 131. The pre-buffer 132 and the output buffer 133 are responsible for transmitting the output from the level shifter 131 to the pad 140.

Due to the need to drive a higher voltage external circuit, the output buffer 133 is often designed to operate at a high voltage environment. To withstand a higher operating voltage, thick oxide metal-oxide-semiconductor (MOS) transistor devices are frequently used to fabricate the output buffer 133. Under the same driving capacity, a thick oxide MOS transistor device will occupy an area larger than a thin oxide MOS transistor device occupies. In other words, the parasitic capacitance value of a thick oxide MOS transistor device is greater than that of a thin oxide MOS transistor device. As a result, the output loading of the pre-buffer 132 will increase and the operating speed of the I/O buffer apparatus 130 can not be sped up. Furthermore, some conventional pre-buffer 132 uses thick oxide MOS transistor devices that the driving capability may be reduced, resulting in slowdown of the operating speed of the I/O buffer apparatus 130. In recent years, a great number of publications (for example, U.S. Pat. No. 6,429,716) have disclosed various methods for improving the aforementioned drawbacks in the conventional techniques.

SUMMARY OF THE INVENTION

Accordingly, at least one object of the present invention is to provide a pre-buffer level shifter for switching levels and driving a buffer having thin oxide MOS transistor devices.

At least a second object of the present invention is to provide an I/O buffer apparatus having a pre-buffer level shifter and a buffer fabricated by thin oxide MOS transistor devices for increasing the operating speed thereof.

To achieve these and other advantages and in accordance with the purpose of the invention, as embodied and broadly described herein, the invention provides a pre-buffer level shifter. The pre-buffer level shifter mainly comprises a switchable current source, a current mirror, a buffer unit, a first clamping circuit and a second clamping circuit. The switchable current source receives a first data signal and determines whether to provide a current to a first current terminal or to a second current terminal of the current mirror according to the first data signal. The first current terminal of the current mirror couples with a first current terminal of the switchable current source. The second current terminal of the current mirror couples with a second current terminal of the switchable current source and outputs a second data signal. An input terminal of the buffer unit couples with the second current terminal of the current mirror and outputs a third data signal. The first clamping circuit couples with the second current terminal of the current mirror for clamping the level of the second data signal. The second clamping circuit couples with an output terminal of the buffer unit for clamping the level of the third data signal.

From another perspective, the present invention also provides an I/O buffer apparatus for generating an output data signal and transmitting the signal to a pad according to a first data signal. The I/O buffer apparatus comprises an output buffer and a pre-buffer level shifter. The output buffer receives a second data signal and a third data signal and outputs the output data signal to the pad accordingly. The output buffer has a set of serially connected transistors. The serially connected transistors comprise a first stacked transistor controlled by the second data signal, at least a second stacked transistor controlled by a first reference voltage, at least a third stacked transistor controlled by a second reference voltage and a fourth stacked transistor controlled by the third data signal. The pre-buffer level shifter couples with the output buffer for converting the level of the first data signal and sending the second data signal and the third data signal to a first output terminal and a second output terminal of the output buffer respectively.

In the present invention, because the pre-buffer level shifter and the output buffer comprise thin oxide MOS transistor devices, the operation speed can be increased. Furthermore, a clamping circuit is also set up to control the voltage swing for driving the output buffer within a desirable voltage range. Hence, the output buffer comprising thin oxide MOS transistor devices can be correctly driven and a greater reliability for the I/O buffer apparatus can be ensured.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
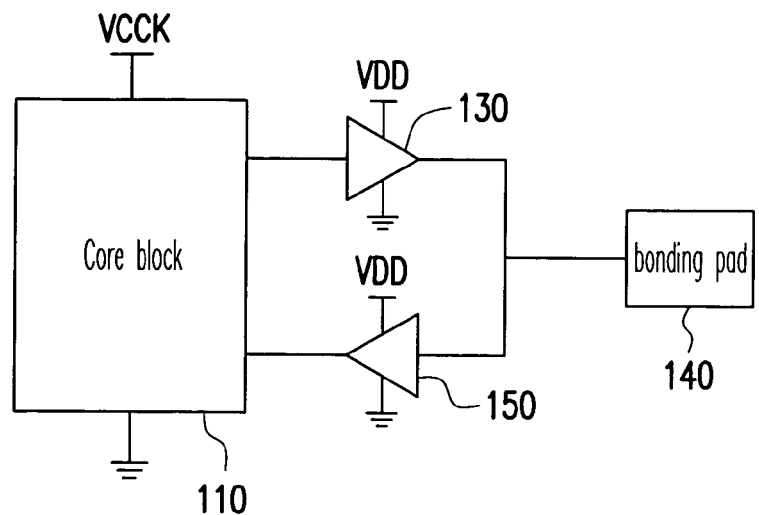
FIG. 1A is a block diagram of a conventional integrated circuit.
Figure 1B:
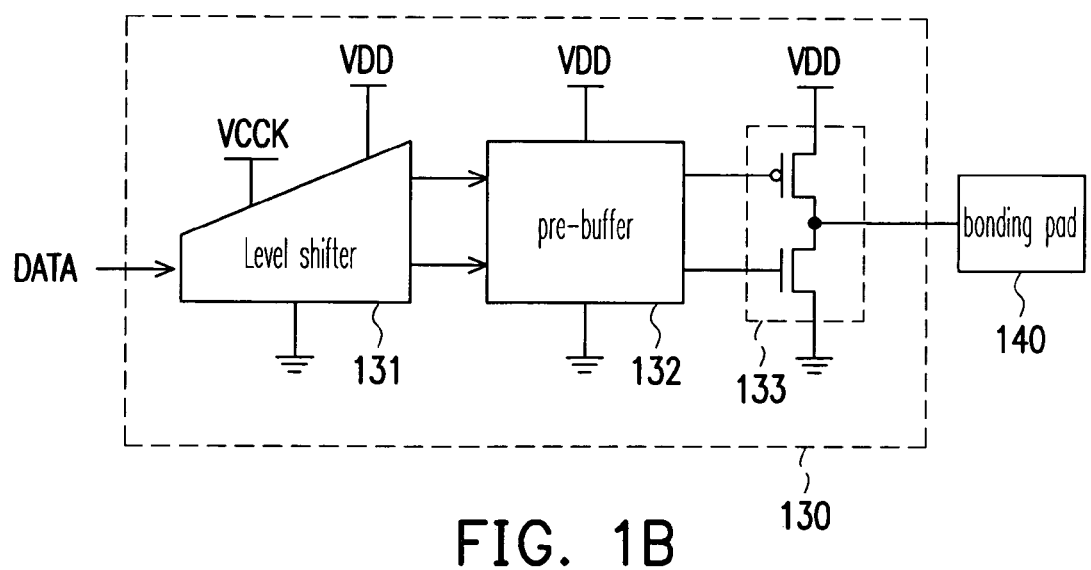
FIG. 1B is a block diagram showing in more detail the I/O buffer apparatus in FIG. 1A.

Reference will now be made in detail to the present preferred embodiments of the invention, examples of which are illustrated in the accompanying drawings. Wherever possible, the same reference numbers are used in the drawings and the description to refer to the same or like parts.

In the following, the scope of the present invention is explained using an I/O buffer apparatus as an example. However, anyone familiar with the technologies may notice that the spirit of the present invention and the indication described in the following embodiment can be applied to other I/O buffer apparatus or bi-directional buffer apparatus as well.

Figure 2:
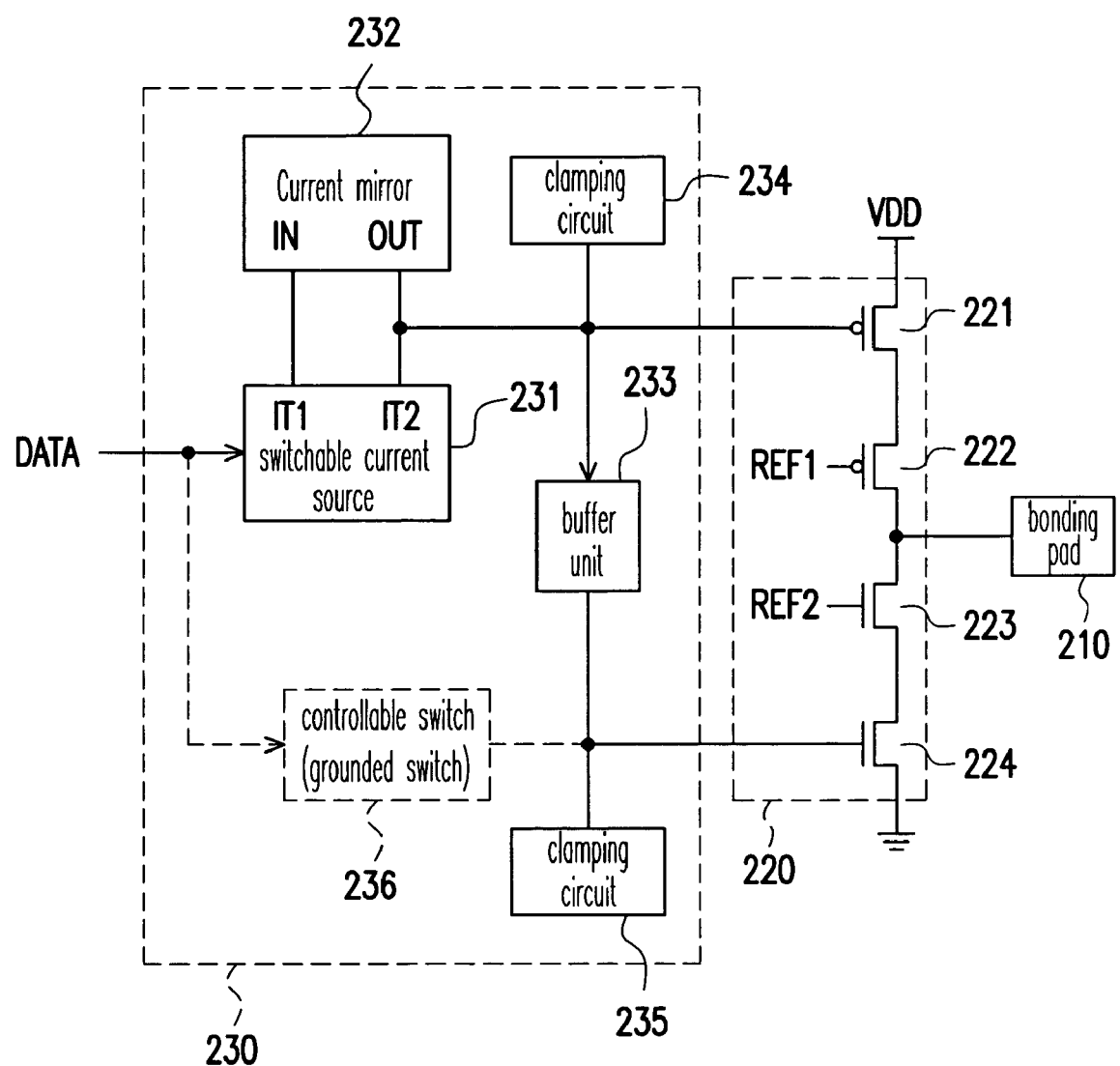
FIG. 2 is a block diagram of an I/O buffer apparatus with a pre-buffer level shifter according to one embodiment of the present invention.

FIG. 2 is a block diagram of an I/O buffer apparatus with a pre-buffer level shifter 230 according to one embodiment of the present invention. As shown in FIG. 2, the I/O buffer apparatus comprising a pre-buffer level shifter 230 and an output buffer 220 couples with a pad 210. The I/O buffer apparatus generates an output data signal according to the first data signal DATA output of a previous circuit stage (for example, a core block) and transmits the output data signal to the pad 210.

The output buffer 220 has a first input terminal, a second input terminal and an output terminal coupled to the pad 210. The output buffer 220 receives a second data signal and a third data signal provided by the pre-buffer level shifter 230 through the first input terminal and the second input terminal and outputs the output data signal to the pad 210 through the output terminal accordingly. In the present embodiment, the output buffer 220 comprises a set of serially connected transistors including a first stacked transistor 221, a second stacked transistor 222, a third stacked transistor 223 and a fourth stacked transistor 224. The transistors 221 and 222 are P-type transistors and the transistors 223 and 224 are N-type transistors. All the transistors within the output buffer 220 can be thin oxide MOS transistor devices.

The gate of the transistor 221 for receiving the second data signal provided by the pre-buffer level shifter 230 is the first input terminal of the output buffer 220. The source of the transistor 221 is coupled to a third voltage (for example, the output port power voltage VDD). The gate of the transistor 222 receives a first reference voltage REF1 (a fixed voltage). The source of the transistor 222 is coupled to the drain of the transistor 221. The drain of the transistor 222 is the output terminal of the output buffer 220. The transistor 222 is maintained in a conductive state because of the bias reference voltage REF1.

The gate of the transistor 223 receives a second reference voltage REF2 (another fixed voltage). The drain of the transistor 223 is coupled to the drain of the transistor 222. The gate of the transistor 224 for receiving the third data signal provided by the pre-buffer level shifter 230 is the second input terminal of the output buffer 220. The drain of the transistor 224 is coupled to the source of the transistor 223. The source of the transistor 224 is coupled to a second voltage (for example, a ground voltage).

The pre-buffer level shifter 230 couples with the output buffer 220 for changing the level of the first data signal DATA and providing the second data signal and the third data signal to the first input terminal and the second input terminal of the output buffer 220 accordingly. The pre-buffer level shifter 230 includes a switchable current source 231, a current mirror 232, a buffer unit 233, a first clamping circuit 234 and a second clamping circuit 235. The switchable current source 231 determines whether to provide a current to a first current terminal IT1 or a second current terminal IT2 according to the first data signal DATA received at the control terminal. The current mirror 232 has a first current terminal IN and a second current terminal OUT. The first current terminal IN of the current mirror 232 is coupled to the first current terminal IT1 of the switchable current source 231. The second current terminal OUT of the current mirror 232 is coupled to the second current terminal IT2 of the switchable current source 231 and the first input terminal of the output buffer 220. The second current terminal OUT of the current mirror 232 outputs the second data signal.

The input terminal of the buffer unit 233 couples with the second current terminal OUT of the current mirror 232 and the output terminal of the buffer unit 233 couples with the second input terminal of the output buffer 220. The signal at the output terminal of the buffer unit 233 is the third data signal. The first clamping circuit 234 couples with the second current terminal OUT of the current mirror 232 for clamping the voltage swing of the second data signal. The second clamping circuit 235 couples with the output terminal of the buffer unit 233 for clamping the voltage swing of the third data signal. In the present embodiment, a clamping circuit is also set up to control the voltage swing for driving the output buffer 220 within a definite voltage range. Hence, the output buffer 220 comprising thin oxide MOS transistor devices can be correctly driven and a greater reliability for the I/O buffer apparatus can be ensured.

All the transistors within the pre-buffer level shifter 230 can be thin oxide MOS transistor devices. Moreover, a controllable switch 236 may be installed in the pre-buffer level shifter 230 depending on the actual requirements. A first terminal of the controllable switch 236 is coupled to the output terminal of the buffer unit 233. The controllable switch 236 determines whether to switch the third data signal to a ground voltage according to the first data signal DATA at a control terminal.

Figure 3:
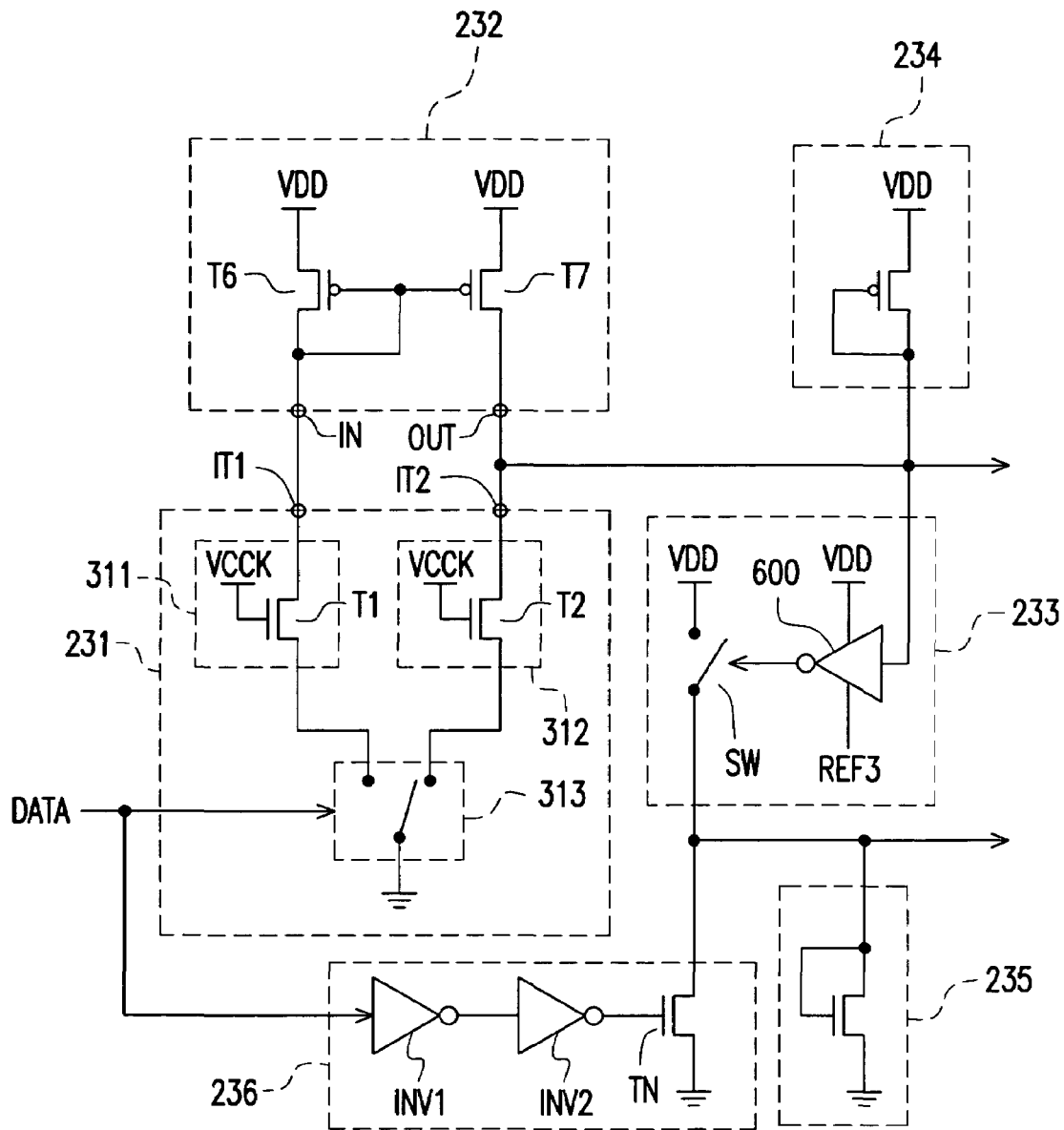
FIG. 3 is a circuit diagram of a pre-buffer level shifter according to one embodiment of the present invention.

The aforementioned pre-buffer level shifter 230 can be implemented according to the following embodiment. FIG. 3 is a circuit diagram of the pre-buffer level shifter 230 shown in FIG. 2. As shown in FIG. 3, the switchable current source 231 comprises a first current source 311, a second current source 312 and a switching device 313. In the present embodiment, the first current source 311 and the second current source 312 are implemented using a first transistor T1 and a second transistor T2 respectively. Both transistors T1 and T2 are N-type transistors. A first terminal (for example, the gate) of the transistor T1 is coupled to a voltage (for example, the core voltage VCCK). A second terminal (for example, the drain) of the transistor T1 is the first current terminal IT1 of the switchable current source 231. A first terminal (for example, the gate) of the transistor T2 is coupled to the first voltage (for example, the core voltage VCCK). A second terminal (for example, the drain) is the second current terminal IT2 of the switchable current source 231. The switching device 313 determines whether to connect its second terminal to its third terminal or fourth terminal according to the signal at the first terminal. The first terminal of the switching device 313 for receiving the first data signal DATA is the control terminal of the switchable current source 231. The second terminal of the switching device 313 is coupled to the second voltage (for example, a ground voltage). The third terminal of the switching device 313 is coupled to the third terminal (for example, the source) of the transistor T1 and the fourth terminal of the switching device 313 is coupled to the third terminal (for example, the source) of the transistor T2.

Figure 4:
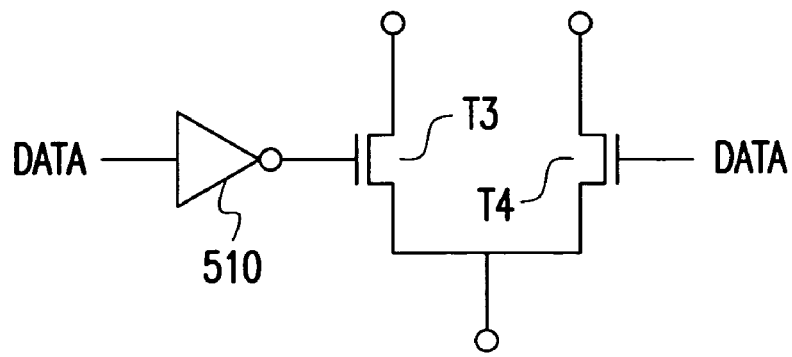
FIG. 4 is a circuit diagram of a switching element in one embodiment of the present invention.

The switching device 313 in FIG. 3 can be implemented using the circuit in FIG. 4. FIG. 4 is a circuit diagram of a switching element in one embodiment of the present invention. As shown in FIG. 4, the switching device 313 comprises an NOT gate 510, a third transistor T3 and a fourth transistor T4. Both transistors T3 and T4 are N-type transistors. The input terminal of the NOT gate 510 and the gate of the transistor T4 for receiving the first data signal DATA are the first terminal of the switching device 313. After receiving the first data signal DATA, the NOT gate 510 inverts the signal and outputs the inverted signal to the gate of the transistor T3. The drain of the transistor T3 is the third terminal of the switching device 313 and the drain of the transistor T4 is the fourth terminal of the switching device 313. The source of the transistor T3 and the source of the transistor T4 are coupled to each other to become the second terminal of the switching device 313. Therefore, the switching device 313 can determine whether to connect the second terminal to the third terminal or to the fourth terminal according to the signal DATA at the first terminal.

Continue to refer to FIG. 3, the current mirror 232 comprises a sixth transistor T6 and a seventh transistor T7. Both the transistors T6 and T7 are P-type transistors. A second terminal (for example, the source) of the transistor T6 is coupled to the third voltage (for example, the output port power voltage VDD). A first terminal (for example, the gate) of the transistor T6 is coupled to a third terminal (for example, the drain) of the transistor T6. The third terminal of the transistor T6 is the first current terminal IN of the current mirror 232. A first terminal (for example, the gate) of the transistor T7 is coupled to the first terminal of the transistor T6. A second terminal (for example, the source) of the transistor T7 is coupled to the third voltage. A third terminal (for example, the drain) of the transistor T7 is the second current terminal OUT of the current mirror 232.

The aforementioned buffer unit 233 comprises an NOT gate 600 and a switch SW, for example. The input terminal of the NOT gate 600 for receiving the second data signal output from the current mirror 232 is the input terminal of the buffer unit 233. The switch SW determines the conductive state between the first terminal and the second terminal according to the control terminal. The control terminal of the switch SW is coupled to the output terminal of the NOT gate 600. The first terminal of the switch SW is coupled to the third voltage (for example, the output port power voltage VDD). The second terminal of the switch SW is the output terminal of the buffer unit 233.

Figure 5:
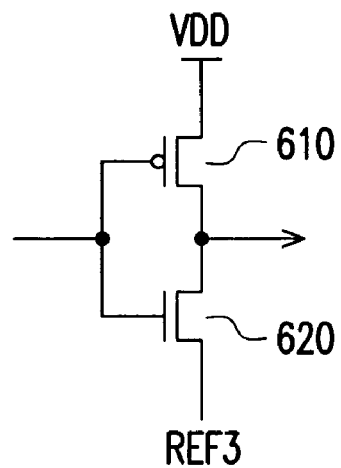
FIG. 5 shows an embodied example of the inverter gate used in FIG. 3 according to the present invention.

FIG. 5 shows an example of the NOT gate 600 in FIG. 3 according to the present invention. As shown in FIG. 5, the NOT gate 600 comprises a P-type transistor 610 and an N-type transistor 620. The gate of the transistor 610 and the gate of the transistor 620 are coupled to each other to form the input terminal of the NOT gate 600. The source of the transistor 610 is coupled to the third voltage (for example, the output port power voltage VDD). The drain of the transistor 610 is the output terminal of the NOT gate 600. The source of the transistor 620 is coupled to a fourth voltage and the drain of the transistor 620 is coupled to the drain of the transistor 610. In the present embodiment, the fourth voltage is the aforementioned third reference voltage REF3 (a fixed voltage).

Figure 6:
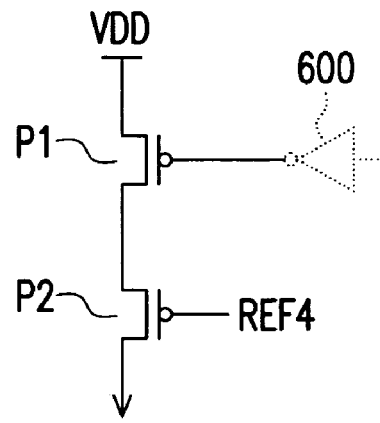
FIG. 6 shows an embodied example of the switch SW used in FIG. 3 according to the present invention.

The switch SW can be implemented in whatever ways that can ensure the reliability of the device like the one in FIG. 6. FIG. 6 shows an example of the switch SW used in FIG. 3 according to the present invention. As shown in FIG. 6, the switch SW comprises P-type transistors P1 and P2. The gate of the transistor P1 is coupled to the output terminal of the NOT gate 600. The source of the transistor P1 is coupled to the third voltage (for example, the output port power voltage VDD). The drain of the transistor P1 is coupled to the source of the transistor P2. The gate of the transistor P2 is coupled to a fifth voltage. The drain of the transistor P2 serves as the second terminal (the output terminal of the buffer unit 233) of the switch SW. In the present embodiment, the fifth voltage is the aforementioned fourth reference voltage REF4 (a fixed voltage).

Anyone familiar with the technique may appropriately set the level of the aforementioned first reference voltage REF1, the second reference voltage REF2, the third reference voltage REF3 and the fourth reference voltage REF4 according to physical requirement. The reference voltages REF1, REF2, REF3 and REF4 can have a same fixed voltage.

Continue to refer to FIG. 3, the first clamping circuit 234 comprises a P-type transistor. The P-type transistor has a source coupled to the third voltage (for example, the output port power voltage VDD), a gate coupled to its drain and the drain coupled to the second current terminal OUT of the current mirror 232. However, the actual method of implementing the first clamping circuit 234 is not limited to the one in FIG. 3. For example, a diode unit may be used to implement the first clamping circuit 234 such that the anode of the diode unit is coupled to the third voltage and the cathode is coupled to the second current terminal OUT of the current mirror 232.

The second clamping circuit 235 comprises an N-type transistor. The N-type transistor has a source coupled to the second voltage (for example, the ground voltage), a gate coupled to its drain and the drain coupled to the output terminal of the buffer unit 233. However, the actual method of implementing the second clamping circuit 235 is not limited to the one in FIG. 3. For example, a diode unit may be used to implement the second clamping circuit 235 such that the cathode of the diode unit is coupled to the second voltage and the anode is coupled to the output terminal of the buffer unit 233.

Furthermore, the controllable switch 236 may comprise a first inverter INV1, a second inverter INV2 and an N-type transistor TN. The input terminal of the inverter INV1 for receiving the first data signal DATA is the control terminal of the controllable switch 236. The input terminal of the inverter INV2 is coupled to the output terminal of the inverter INV1. The inverters INV1 and INV2 buffer the received first data signal DATA and output the data signal to the gate of the transistor TN. The source (the second terminal of the controllable switch 236) of the transistor TN is coupled to the second voltage (for example, the ground voltage). The drain (the first terminal of the controllable switch 236) of the transistor TN is coupled to the output terminal of the buffer unit 233. Therefore, the third data signal can be controlled so that the third data signal is coupled to a ground according to the first data signal DATA.

In summary, the pre-buffer level shifter and I/O buffer apparatus of the present invention use thin oxide MOS transistor devices so that their operation speeds are increased. Furthermore, a clamping circuit is also set up to control the voltage swing for driving the output buffer within an appropriate voltage range. Hence, the output buffer comprising thin oxide MOS transistor devices can be correctly driven and a greater reliability for the I/O buffer apparatus can be ensured.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pre-buffer level shifter, comprising:
   a switchable current source for receiving a first data signal and determining whether to provide a current to a first current terminal or to a second current terminal according to the first data signal;
   a current mirror having a first current terminal and a second current terminal, wherein the first current terminal of the current mirror is coupled to the first current terminal of the switchable current source and the second current terminal of the current mirror for outputting a second data signal is coupled to the second current terminal of the switchable current source;
   a buffer unit for outputting a third data signal coupled to the second current terminal of the current mirror;
   a first clamping circuit for clamping the voltage swing of the second data signal coupled to the second current terminal of the current mirror;
   a second clamping circuit for clamping the voltage swing of the third data signal coupled to the buffer unit; and
   a controllable switch having a control terminal, a first terminal and a second terminal, wherein the first terminal is coupled to the output terminal of the buffer unit for determining whether to connect a voltage at its second terminal to its first terminal according to the first data signal at the control terminal thereof.

2. The pre-buffer level shifter of claim 1, wherein the switchable current source comprises:
   a first transistor having a voltage input terminal, the first current terminal of the switchable current source and a third terminal such that the current flowing in the first current terminal of the switchable current source and the third terminal is determined according to a first voltage at the voltage input terminal;
   a second transistor having a voltage input terminal, the second current terminal of the switchable current source and a third terminal such that the current flowing in the second current terminal of the switchable current source and the third terminal is determined according to the first voltage at the voltage input terminal; and
   a switching element having a control terminal for the switchable current source, a second terminal, a third terminal and a fourth terminal, wherein the second terminal is coupled to the third terminal or to the fourth terminal according to the signal at the control terminal of the switchable current source, wherein the second terminal of the switching element is coupled to a second voltage, the third terminal of the switching element is coupled to the third terminal of the first transistor, and the fourth terminal of the switching element is coupled to the third terminal of the second transistor.

3. The pre-buffer level shifter of claim 2, wherein the switching element further comprises:
   an NOT gate whose input terminal is the control terminal of the switchable current source;
   a third transistor having a first terminal coupled to the output terminal of the NOT gate, the second terminal of the switching element and the third terminal of the switching element, wherein the conductive state between the second terminal and the third terminal of the switching element is determined according to the signal at the first terminal of the third transistor; and
   a fourth transistor having a first terminal coupled to the input terminal of the NOT gate, the second terminal of the switching element and the fourth terminal of the switching element, wherein the conductive state between the second terminal and the fourth terminal of the switching element is determined according to the signal at the first terminal of the fourth transistor.

4. The pre-buffer level shifter of claim 1, wherein the current mirror further comprises:
   a sixth transistor having a first terminal, a second terminal and the first current terminal of the current mirror for determining the current flowing in the second terminal and the first current terminal of the current mirror according to the first terminal of the sixth transistor, wherein the second terminal is coupled to a third voltage and the first terminal is coupled to the first current terminal of the current mirror; and
   a seventh transistor having a first terminal, a second terminal and the second current terminal of the current mirror for determining the current flowing in the second terminal and the second current terminal of the current mirror according to the first terminal of the seventh transistor, wherein the first terminal of the seventh transistor is coupled to the first terminal of the sixth transistor and the second terminal of the seventh transistor is coupled to the third voltage.

5. The pre-buffer level shifter of claim 1, wherein the buffer unit comprises:
   an NOT gate whose input terminal is the input terminal of the buffer unit; and
   a switch having a control terminal, a first terminal and a second terminal for determining the conductive state of the first terminal thereof and the second terminal thereof according to the control terminal, wherein the control terminal of the switch is coupled to the output terminal of the NOT gate and the first terminal of the switch is coupled to a third voltage, and the second terminal of the switch is the output terminal of the buffer unit.

6. The pre-buffer level shifter of claim 5, wherein the NOT gate comprises:
   a P-type transistor whose gate is the input terminal of the NOT gate, whose source is coupled to the third voltage and whose drain is the output terminal of the NOT gate; and an N-type transistor whose gate is coupled to the gate of the P-type transistor, whose source is coupled to a fourth voltage and whose drain is coupled to the drain of the P-type transistor.

7. The pre-buffer level shifter of claim 5, wherein the switch comprises:
a first P-type transistor whose gate is the control terminal of the switch, whose source is the first terminal of the switch; and
a second P-type transistor whose gate is coupled to a fifth voltage, whose source is coupled to the drain of the first P-type transistor, and the source of the second P-type transistor is the second terminal of the switch.

8. The pre-buffer level shifter of claim 1, wherein the first clamping circuit comprises a P-type transistor having a source coupled to a third voltage, a gate coupled to its drain and the drain coupled to the second current terminal of the current mirror.

9. The pre-buffer level shifter of claim 1, wherein the first clamping circuit comprises a diode unit having an anode coupled to a third voltage and a cathode coupled to the second current terminal of the current mirror.

10. The pre-buffer level shifter of claim 1, wherein the second clamping circuit comprises an N-type transistor having a source coupled to a second voltage and a gate coupled to its drain and the drain coupled to the output terminal of the buffer unit.

11. The pre-buffer level shifter of claim 1, wherein the second clamping circuit comprises a diode unit having a cathode coupled to a second voltage and an anode coupled to the output terminal of the buffer unit.

12. The pre-buffer level shifter of claim 1, wherein the controllable switch comprises:
a first NOT gate whose input terminal is the control terminal of the controllable switch;
a second NOT gate whose input terminal is coupled to the output terminal of the first NOT gate; and
an N-type transistor whose gate is coupled to the output terminal of the second NOT gate, whose source is the second terminal of the controllable switch and whose drain is the first terminal of the controllable switch.

13. An I/O (input/output) buffer apparatus for generating an output data signal according to a first data signal and transmitting the output data signal to a pad, wherein the I/O buffer apparatus comprising:
an output buffer for receiving an second data signal and a third data signal, and outputting the output data signal to the pad according to the second data signal and the third data signal, wherein the output buffer has a set of serially connected transistors comprising a first stacked transistor controlled by the second data signal, at least a second stacked transistor controlled by a first reference voltage, at least a third stacked transistor controlled by a second reference voltage and a fourth stacked transistor controlled by the third data signal; and
a pre-buffer level shifter coupled to the output buffer for changing the level of the first data signal and providing the second data signal and the third data signal to the output buffer accordingly, wherein the pre-buffer level shifter comprising:
a switchable current source for receiving a first data signal and determining whether to provide a current to a first current terminal or to a second current terminal according to the first data signal;
a current mirror having a first current terminal and a second current terminal, wherein the first current terminal of the current mirror is coupled to the first current terminal of the switchable current source and the second current terminal of the current mirror is coupled to the second current terminal of the switchable current source and the first input terminal of the output buffer, wherein the signal in the second current terminal of the current minor is the second data signal;
a buffer unit whose input terminal is coupled to the second current terminal of the current mirror, whose output terminal for outputting the third data signal is coupled to the second input terminal of the output buffer;
a first clamping circuit for clamping the voltage swing of the second data signal coupled to the second current terminal of the current mirror;
a second clamping circuit for clamping the voltage swing of the third data signal coupled to the output terminal of the buffer unit; and
a controllable switch having a control terminal, a first terminal and a second terminal such that the first terminal is coupled to the output terminal of the buffer unit for determining whether to connect a voltage at the second terminal to its first terminal according to the first data signal at the control terminal.

14. The I/O buffer apparatus of claim 13, wherein the switchable current source comprises:
a first transistor having a first terminal, a second terminal and a third terminal for determining the current flowing in the second terminal and the third terminal according to the first terminal, wherein the first terminal of the first transistor is coupled to a first voltage and the second terminal of the first transistor is the first current terminal of the switchable current source;
a second transistor having a first terminal, a second terminal and a third terminal for determining the current flowing in the second terminal and the third terminal according to the first terminal, wherein the first terminal of the second transistor is coupled to the first voltage and the second terminal of the second transistor is the second current terminal of the switchable current source; and
a switching element having a first terminal, a second terminal, a third terminal and a fourth terminal for determining whether to couple the second terminal to the third terminal or to the fourth terminal according to the signal received at the first terminal, wherein the first terminal of the switching element is the control terminal of the switchable current source, the second terminal of the switching element is coupled to a second voltage, the third terminal of the switching element is coupled to the third terminal of the first transistor, and the fourth terminal of the switching element is coupled to the third terminal of the second transistor.

15. The I/O buffer apparatus of claim 14, wherein the switching element further comprises:
an NOT gate whose input terminal is the first terminal of the switching element;
a third transistor having a first terminal, a second terminal and a third terminal for determining the conductive state between the second terminal thereof and the third terminal thereof according to the first terminal thereof, wherein the first terminal of the third transistor is coupled to the output terminal of the NOT gate, the second terminal of the third transistor is the third terminal of the switching element, and the third terminal of the third transistor is the second terminal of the switching element; and a fourth transistor having a first terminal, a second terminal and a third terminal for determining the conductive state between the second terminal thereof and the third terminal thereof according to the first terminal thereof, wherein the first terminal of the fourth transistor is coupled to the input terminal of the NOT gate, the second terminal of the fourth transistor is the fourth terminal of the switching element, and the third terminal of the fourth transistor is coupled to the third terminal of the third transistor.

16. The I/O buffer apparatus of claim 13, wherein the current mirror further comprises:
a sixth transistor having a first terminal, a second terminal and a third terminal for determining the current flowing in the second terminal and the third terminal according to the first terminal, wherein the second terminal of the sixth transistor is coupled to a third voltage, the first terminal of the sixth transistor is coupled to the third terminal of the sixth transistor and the third terminal of the sixth transistor is the first current terminal of the current mirror; and
a seventh transistor having a first terminal, a second terminal and a third terminal for determining the current flowing in the second terminal and the third terminal according to the first terminal, wherein the first terminal of the seventh transistor is coupled to the first terminal of the sixth transistor, the second terminal of the seventh transistor is coupled to the third voltage, and the third terminal of the seventh transistor is the second current terminal of the current mirror.

17. The I/O buffer apparatus of claim 13, wherein the buffer unit comprises:
an NOT gate whose input terminal is the input terminal of the buffer unit; and
a switch having a control terminal, a first terminal and a second terminal for determining the conductive state between the first terminal and the second terminal according to the signal at the control terminal, wherein the control terminal of the switch is coupled to the output terminal of the NOT gate, the first terminal of the switch is coupled to a third voltage, and the second terminal of the switch is the output terminal of the buffer unit.

18. The I/O buffer apparatus of claim 17, wherein the NOT gate comprises:
a P-type transistor whose gate is the input terminal of the NOT gate, whose source is coupled to the third voltage and whose drain is the output terminal of the NOT gate; and
an N-type transistor whose gate is coupled to the gate of the P-type transistor, whose source is coupled to a fourth voltage and whose drain is coupled to the drain of the P-type transistor.

19. The I/O buffer apparatus of claim 17, wherein the switch comprises:
a first P-type transistor whose gate is the control terminal of the switch and whose source is the first terminal of the switch; and a second P-type transistor whose gate is coupled to a fifth voltage and whose source is coupled to the drain of the first P-type transistor such that the source is also the second terminal of the switch.

20. The I/O buffer apparatus of claim 13, wherein the first clamping circuit further comprises a P-type transistor whose source is coupled to a third voltage and whose gate is coupled to its drain such that the drain is also coupled to the second current terminal of the current mirror.

21. The I/O buffer apparatus of claim 13, wherein the first clamping circuit comprises a diode unit having an anode coupled to a third voltage and a cathode coupled to the second current terminal of the current mirror.

22. The I/O buffer apparatus of claim 13, wherein the second clamping circuit comprises an N-type transistor having a source coupled to a second voltage and a gate coupled to its drain such that the drain is also coupled to the output terminal of the buffer unit.

23. The I/O buffer apparatus of claim 13, wherein the second clamping circuit comprises a diode unit having a cathode coupled to a second voltage and an anode coupled to the output terminal of the buffer unit.

24. The I/O buffer apparatus of claim 13, wherein the controllable switch comprises:
a first inverter whose input terminal is the control terminal of the controllable switch;
a second inverter whose input terminal is coupled to the output terminal of the first inverter; and
an N-type transistor whose gate is coupled to the output terminal of the second inverter, whose source is the second terminal of the controllable switch, and whose drain is the first terminal of the controllable switch.

25. The I/O buffer apparatus of claim 13, wherein the set of serially connected transistors comprises:
the first stacked transistor whose gate is the first input terminal of the output buffer, wherein the source of the first stacked transistor is coupled to a third voltage;
the second stacked transistor whose gate receives the first reference voltage, whose source is coupled to the drain of the first stacked transistor, and whose drain is the output terminal of the output buffer;
the third stacked transistor whose gate receives the second reference voltage, and whose drain is coupled to the drain of the second stacked transistor; and
the fourth stacked transistor whose gate is the second output terminal of the output buffer, whose drain is coupled to the source of the third stacked transistor, and whose source is coupled to a second voltage.

26. The I/O buffer apparatus of claim 25, wherein the third voltage is an output port power voltage and the second voltage is a ground voltage.

* * * * *